United States Patent [19]

Ishihara

[11] Patent Number: 5,199,469
[45] Date of Patent: Apr. 6, 1993

[54] EXTERIOR LEAD FORMING DEVICE FOR SEMICONDUCTOR DEVICES

[75] Inventor: Kaoru Ishihara, Fukuoka, Japan

[73] Assignee: Mitsubishi Denki Kabushiki Kaisha, Tokyo, Japan

[21] Appl. No.: 752,001

[22] Filed: Aug. 29, 1991

[30] Foreign Application Priority Data

Aug. 31, 1990 [JP] Japan .................. 2-228014

[51] Int. Cl.⁵ .............................................. B21F 1/00
[52] U.S. Cl. ......................................... 140/105; 72/37
[58] Field of Search ................ 140/105, 147; 72/37

[56] References Cited

U.S. PATENT DOCUMENTS 4,644,633  2/1987  Jones et al. ........................ 140/105
4,705,081  11/1987 Birk et al. .......................... 140/147
4,817,266  4/1989  Holcomb ............................ 140/105

FOREIGN PATENT DOCUMENTS 34637     2/1987  Japan ................... 140/105
63-25961  2/1988  Japan .
183723    7/1988  Japan ................... 140/105
278917   11/1989  Japan ................... 140/105

Primary Examiner—Lowell A. Larson
Attorney, Agent, or Firm—Leydig, Voit & Mayer

[57] ABSTRACT

An exterior lead forming device for semiconductor devices includes a pair of roller holders rotatably attached to a punch plate. When the punch plate is lowered, the leads of a semiconductor device fixedly held on a bending die by a pressing plate are bent along the sides of the bending die. The paths of the bending rollers are monitored by a camera and path errors, calculated by a comparator, are fed back to a motor control circuit to adjust the positions of bending roller guide plates and thereby correct the path errors.

2 Claims, 3 Drawing Sheets

FIG. 4(a)
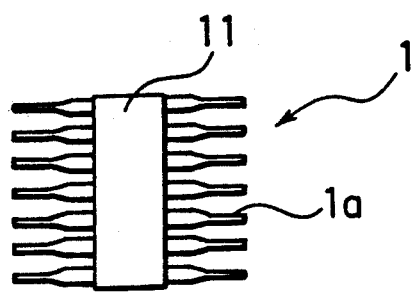
FIG. 4(b)
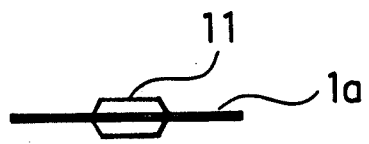
FIG. 5(a)     FIG. 5(b)
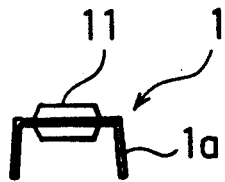   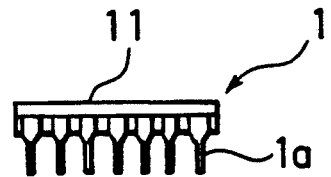

EXTERIOR LEAD FORMING DEVICE FOR SEMICONDUCTOR DEVICES

BACKGROUND OF THE INVENTION

This invention relates to exterior lead forming devices for forming exterior leads of semiconductor devices into predetermined forms.

FIG. 2 is an end view of a conventional semiconductor lead forming device. A semiconductor device 1 is positioned on a bending die 3 fixedly supported on a die plate 2. The bending die 3 positions the semiconductor device 1 precisely at a predetermined position. On the lower surface of a punch plate 4 fixed to a press ram (not shown) is attached a U-shaped forming member 5. Bending rollers 7 are rotatably supported on guide pins 6 at the ends of forming member 5. A pressing plate 8 opposing the bending die 3 is slidably attached to the punch plate 4 via a guide shaft 9, to fixedly hold the exterior leads 1a of the semiconductor device 1 on the bending die 3 during the bending of the exterior leads 1a. The guide shaft 9 urges the pressing plate 8 downward to clamp the exterior leads 1a.

The semiconductor device 1 having the exterior leads 1a which are bent and formed by the exterior leads forming device is obtained as follows. First, as shown in FIG. 3, semiconductor elements are mounted on a lead frame 10 and encapsulated with synthetic resin 11. Next, the connector portions 12 connecting the leads together and the end portions 13 of the leads are cut away to produce separate semiconductor devices, as shown in FIG. 4.

The exterior leads 1a of the semiconductor device 1 as shown in FIG. 4 are bent by means of the exterior lead forming device of FIG. 2 as follows. First, the semiconductor device 1 as shown in FIG. 4 is positioned on the bending die 3 as shown in FIG. 2. Next, the punch plate 4 is lowered such that the end surfaces 8a of the pressing plate 8 come into contact with the upper surfaces of the exterior leads 1a. The semiconductor device 1 is thus fixedly held on the bending die 3 by means of the pressing plate 8. The punch plate 4 is lowered further to bend the exterior leads 1a with the bending rollers 7 along the side surfaces of the bending die 3. The exterior leads 1a are bent in accordance with the form of the bending die 3. The bending rollers 7 rotate on respective guide pins 6 to bend the exterior leads 1a. FIGS. 5(a) and 5(b) respectively show an end view and a side view of a semiconductor device the exterior leads of which have been bent into a predetermined form.

The conventional exterior lead forming device has the following disadvantage. The totality of bending stress developed during bending of the exterior leads 1a is supported by the guide pins 6. Further, the outer circumferential surface of the guide pins 6 and the inner circumferential surface of the bending rollers 7 slide on each other in response to the forming stress. Thus, due to abrasions, a gap greater than a predetermined magnitude may be formed at the support and the rotating contact portions of the guide pins 6. If this happens, the predetermined bending form and dimension of the exterior leads 1a can no longer be obtained. Due to the resulting dimensional errors, the yield of the semiconductor device production is reduced, and reworking of the semiconductor devices may become necessary.

SUMMARY OF THE INVENTION

It is therefore an object of this invention to provide an exterior lead forming device for semiconductor devices which has a simple structure and for forming the exterior leads of semiconductor devices precisely into predetermined forms and dimensions even after prolonged operation.

The above object is accomplished in accordance with the principle of this invention by a exterior lead forming device for semiconductor devices which comprises: a bending die for supporting a semiconductor device thereon; a pressing member for pressing the semiconductor device on said bending die, thereby fixedly holding the semiconductor device on said bending die; a forming member having a forming portion which moves along a side of said bending die to bend the exterior leads of the semiconductor device along said side of the bending die, wherein the path of the forming portion with respect to the side of the bending die is adjustable; and a guide member for guiding movement of said forming member, a position of said guide member being adjustable for adjusting the path of said forming member to a predetermined target path.

Preferably, the exterior lead forming device further comprises: imaging means for monitoring the path of the forming portion of said forming member; comparison means for comparing an actual path of the forming portion with a target orbit thereof, said comparison means determining an error of the actual path with respect to the target orbit; and adjustment means for adjusting a position of said guide member such that the actual path of the forming portion coincides with the target path.

BRIEF DESCRIPTION OF THE DRAWINGS

The features of this invention are set forth with particularity in the appended claims. The structure and method of operation of this invention itself, however, will be best understood from the following detailed description, taken in conjunction with the accompanying drawings, in which:

FIG. 4(a) is a plan view and FIG. 4(b) is and an end view of a semiconductor device before lead forming; and and and FIG. 5(a) is an end view and FIG. 5(b) is and a side view of a semiconductor device the exterior leads of which have been bent into a predetermined form.

In the drawings, like reference numerals represent like or corresponding parts or portions.

DETAILED DESCRIPTION OF THE PREFERRED EMBODIMENT

Referring now to the accompanying drawings, the preferred embodiment of this invention is described.

Figure 1:
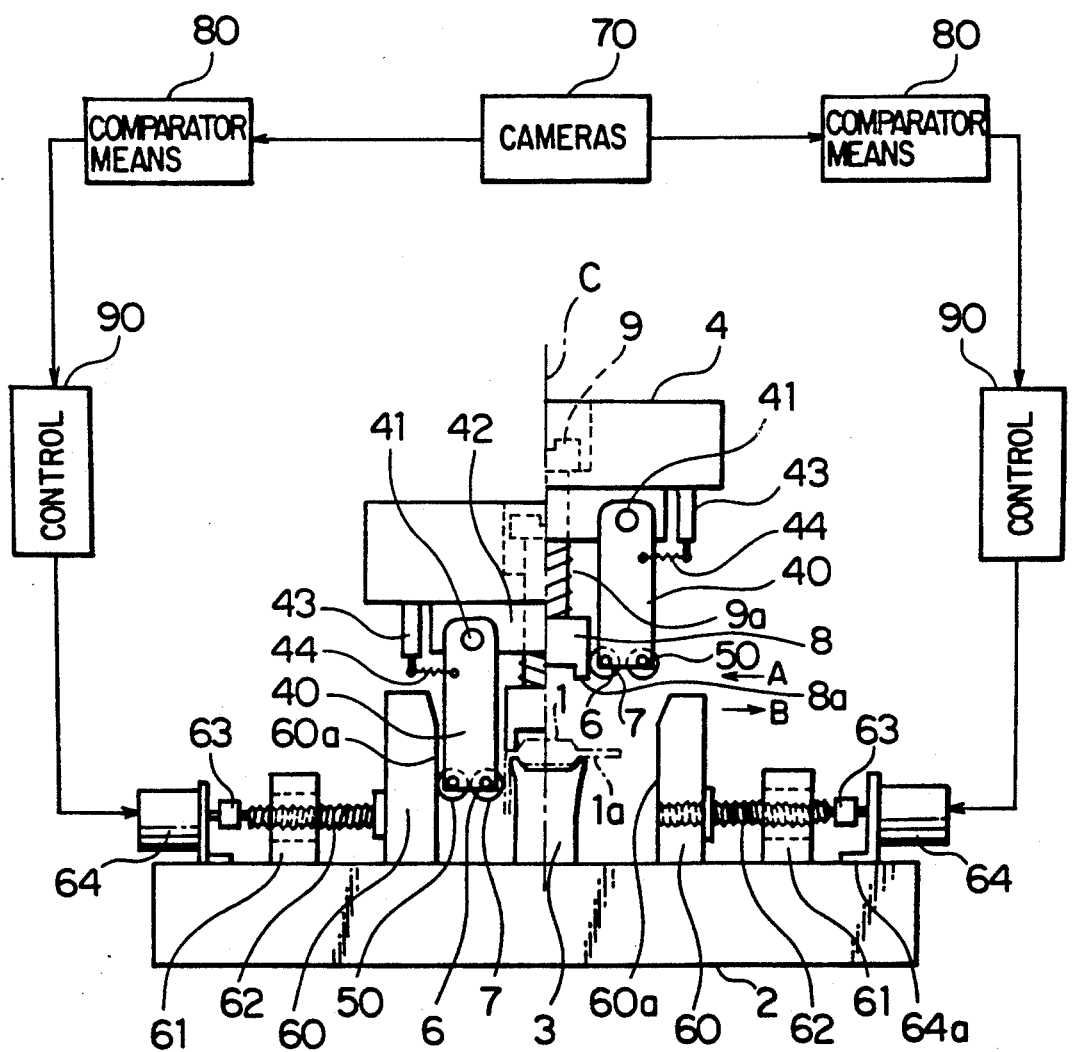
FIG. 1 is an end view of a semiconductor lead forming device according to the invention.
Figure 2:
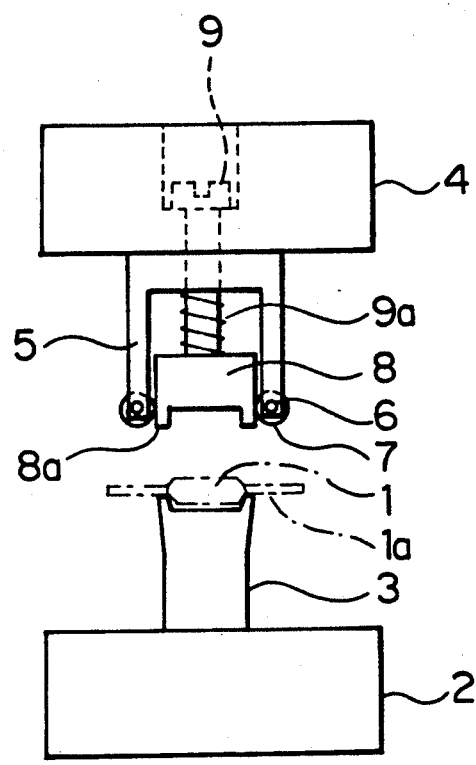
FIG. 2 is an end view of a conventional semiconductor lead forming device.
Figure 3:
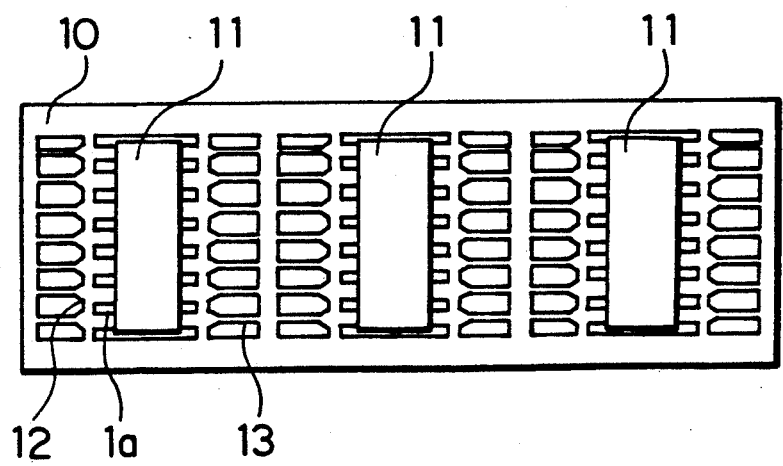
FIG. 3 is a plan view of a lead frame on which semiconductor elements are mounted for producing semiconductor devices.

FIG. 1 is an end view of a semiconductor lead forming device according to this invention. A semiconductor device 1 having exterior leads 1a is positioned on a bending die 3 fixedly supported on a die plate 2. A pressing plate 8 is vertically slidably attached to a punch plate 4 via a guide shaft 9, and urged upward via a compression spring 9a.

Further, a pair of forming members, i.e., roller holders 40, are rotatably attached to a bearing support member 42 fixed to the bottom of the punch plate 4. The roller holders 40 are urged away from the pressing plate 8 by respective tension springs 44 attached to the roller holders 40 and spring attachment plates 43. The bending rollers 7 are rotatably attached to the respective inner bottom ends of the roller holders 40 via guide pins 6 for bending the exterior leads 1a of the semiconductor device 1. The forming surfaces (outer circumferential surfaces) of the bending rollers 7 constitute the forming portions of the exterior lead forming device. The guide rollers 50 are rotatably attached to the respective outer bottom ends of the roller holders 40, which are guided on the respective inner side surfaces (guide surfaces) 60a of the guide plates 60, as described in detail below. The guide members, i.e., guide plates 60, are coupled to respective motors 64 fixed on the motor attachment plate 64a, via respective ball threads 62 meshing with respective thread guide plates 61 and via respective joints 63. The guide plates 60 are slidably attached to the die plate 2 and are slidable in the horizontal direction as shown by the arrows A and B. Thus, the guide plates 60 are driven by the respective motors 64 via the ball threads 62, and slide on the die plate 2 such that the positions of the inner side surfaces (guide surfaces) 60a are adjusted.

The positions of the forming surfaces (the surfaces which come in contact with the exterior leads 1a) of the respective bending rollers 7 are monitored by cameras (two-dimensional imaging devices) 70, shown schematically in FIG. 1. The cameras (two-dimensional imaging devices) 70 may actually be positioned in front of the movement orbits of the bending rollers 7 (above the sheet of drawing of FIG. 1). Comparator means 80 compares the actual paths of the bending rollers 7 detected by the cameras (two-dimensional imaging devices) 70 with respective target paths stored in a memory, and feeds back the path errors to the respective motor control circuits 90.

The forming operation of exterior lead forming device of FIG. 1 is as follows. First, the semiconductor device 1 is positioned on the bending die 3, as shown at the right of the center line C, and the punch plate 4 is lowered to fixedly hold the semiconductor device 1 on the bending die 3 by means of the end surface 8a of the pressing plate 8. When the punch plate 4 is lowered further, the roller holders 40, which are urged toward the respective guide plates 60 via the tension springs 44, are guided on the inner side surfaces (guide surfaces) 60a of the guide plates 60 via the guide rollers 50. The upper portions of the inner side surfaces (guide surfaces) 60a are slanted downward toward the side surfaces of the bending die 3 by a predetermined angle. Since the guide rollers 50 are guided on respective slanted inner side surfaces (guide surfaces) 60a, the bending rollers 7 bend the respective exterior leads 1a along the side surfaces of the bending die 3 that are tapered downward toward the center line C, as shown at the left of the center line C in FIG. 1. A predetermined small angle is formed between the respective side surfaces of the bending die 3 and the exterior leads 1a.

During the bending operation, the paths of the bending rollers 7 are monitored by the cameras (two-dimensional imaging devices) 70, and the actual paths monitored the cameras (two-dimensional imaging devices) 70 are compared with the respective target paths stored in the comparator means 80. The path errors (the differences between the actual and the target paths) calculated by the comparator means 80 are fed back to the motor control circuits 90 for the respective motors 64, such that the motors 64 are driven to adjust the positions of the guide plates 60 to reduce the path errors.

This invention is not limited to the above embodiment. In the case of the above embodiment, the roller holders 40 are provided with separate bending rollers 7 for forming the exterior leads 1a of the semiconductor device 1, and the paths of the bending rollers 7 are adjusted to the target paths thereof. However, the roller holders 40 themselves may be provided with integrally formed forming portions, the paths of these forming portions being adjusted to the target paths. Further, in the case of the above embodiment, guide plates 60 are provided for guiding the movements of the forming portions. However, the forming members themselves may be provided with driving means by means of which the paths of the forming portions may be controlled.

What is claimed is:

1. An exterior lead forming device for bending exterior leads of a semiconductor device into a predetermined form comprising:

a bending die having sides and for supporting a semiconductor device;

a pressing member for holding a semiconductor device on the bending die;

a forming member having a roller rotatably mounted thereon and movable along a side of the bending die to bend the exterior leads of the semiconductor device along the side of the bending die;

a guide member adjustable in position for guiding the forming member as the forming member moves along the side of the die such that the roller moves along a path in rolling contact with the exterior leads;

imaging means for monitoring the path of the roller;

comparison means for comparing the path of the roller monitored by the imaging means with a target path and for determining an error between the monitored path and the target path; and adjustment means responding to the comparison means for adjusting the position of the guide member to reduce the error between the monitored path and the target path.

2. An exterior lead forming device as claimed in claim 1 including a punch plate slidable generally parallel to the side of the bending die wherein the pressing member and the forming member are attached to the punch plate.

* * * * *